(12) United States Patent
Shimizu et al.

(10) Patent No.: US 9,512,541 B2
(45) Date of Patent: Dec. 6, 2016

(54) SELECTIVE GROWTH METHOD AND SUBSTRATE PROCESSING APPARATUS

(71) Applicant: TOKYO ELECTRON LIMITED, Tokyo (JP)

(72) Inventors: Akira Shimizu, Nirasaki (JP); Masayuki Kitamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/887,685

(22) Filed: Oct. 20, 2015

(65) Prior Publication Data

US 2016/0126106 A1 May 5, 2016

(30) Foreign Application Priority Data

Oct. 29, 2014 (JP) ................................. 2014-220157

(51) Int. Cl.
| | | |
|---|---|---|
| *C30B 25/18* | (2006.01) | |
| *H01L 21/02* | (2006.01) | |
| *C30B 25/16* | (2006.01) | |
| *C23C 16/52* | (2006.01) | |
| *H01L 21/285* | (2006.01) | |

(52) U.S. Cl.
CPC ............... *C30B 25/18* (2013.01); *C23C 16/52* (2013.01); *C30B 25/165* (2013.01); *H01L 21/02115* (2013.01); *H01L 21/02164* (2013.01); *H01L 21/02211* (2013.01); *H01L 21/02271* (2013.01); *H01L 21/02304* (2013.01); *H01L 21/02312* (2013.01); *H01L 21/28568* (2013.01)

(58) Field of Classification Search
CPC ................... H01L 21/02115; H01L 21/02164; H01L 21/02211; H01L 21/02271; H01L 21/02304; H01L 21/02312; H01L 21/02334
See application file for complete search history.

(56) References Cited

U.S. PATENT DOCUMENTS

| | | | | |
|---|---|---|---|---|
| 7,696,106 B2* | 4/2010 | Okada | ..................... | C23C 16/26 257/E21.27 |
| 7,943,520 B2* | 5/2011 | Hirota | ............... | H01L 21/02115 257/E21.577 |
| 8,487,449 B2* | 7/2013 | Wada | ..................... | B82Y 10/00 257/758 |
| 8,648,464 B2* | 2/2014 | Kitamura | .......... | H01L 21/02491 257/750 |
| 2005/0274996 A1* | 12/2005 | Iwawaki | ............... | H01L 31/103 257/292 |
| 2008/0299780 A1* | 12/2008 | Elliott | ............... | H01L 21/31116 438/770 |

(Continued)

FOREIGN PATENT DOCUMENTS

| | | |
|---|---|---|
| JP | 2009-231836 A | 10/2009 |
| JP | 2014-175337 A | 9/2014 |

*Primary Examiner* — Fernando L Toledo
*Assistant Examiner* — Christine L Hagan
(74) *Attorney, Agent, or Firm* — Nath, Goldberg & Meyer; Jerald L. Meyer

(57) ABSTRACT

There is provided a selective growth method of selectively growing a thin film on exposed surfaces of an underlying insulation film and an underlying metal film, which includes: selectively growing a film whose thickness is decreased by combustion on the underlying metal film using metal of the underlying metal film as a catalyst; and selectively growing a silicon oxide film on the underlying insulation film while combusting the film whose thickness is decreased by combustion.

10 Claims, 13 Drawing Sheets

(56) References Cited

U.S. PATENT DOCUMENTS

| | | | |
|---|---|---|---|
| 2009/0029562 A1* | 1/2009 | Okada | C23C 16/26 |
| | | | 438/763 |
| 2009/0093120 A1* | 4/2009 | Hirota | H01L 21/02115 |
| | | | 438/694 |
| 2012/0049370 A1* | 3/2012 | Wada | B82Y 10/00 |
| | | | 257/751 |
| 2012/0228614 A1* | 9/2012 | Kitamura | H01L 21/02491 |
| | | | 257/52 |

* cited by examiner

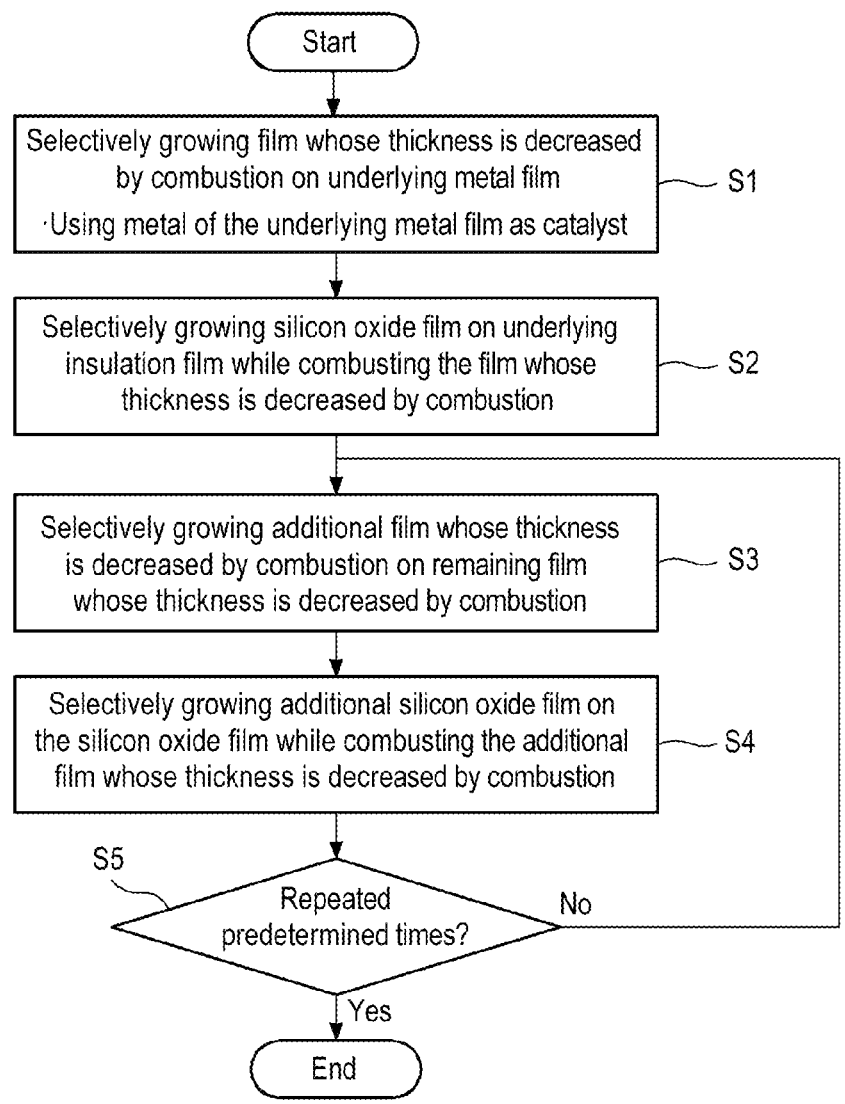

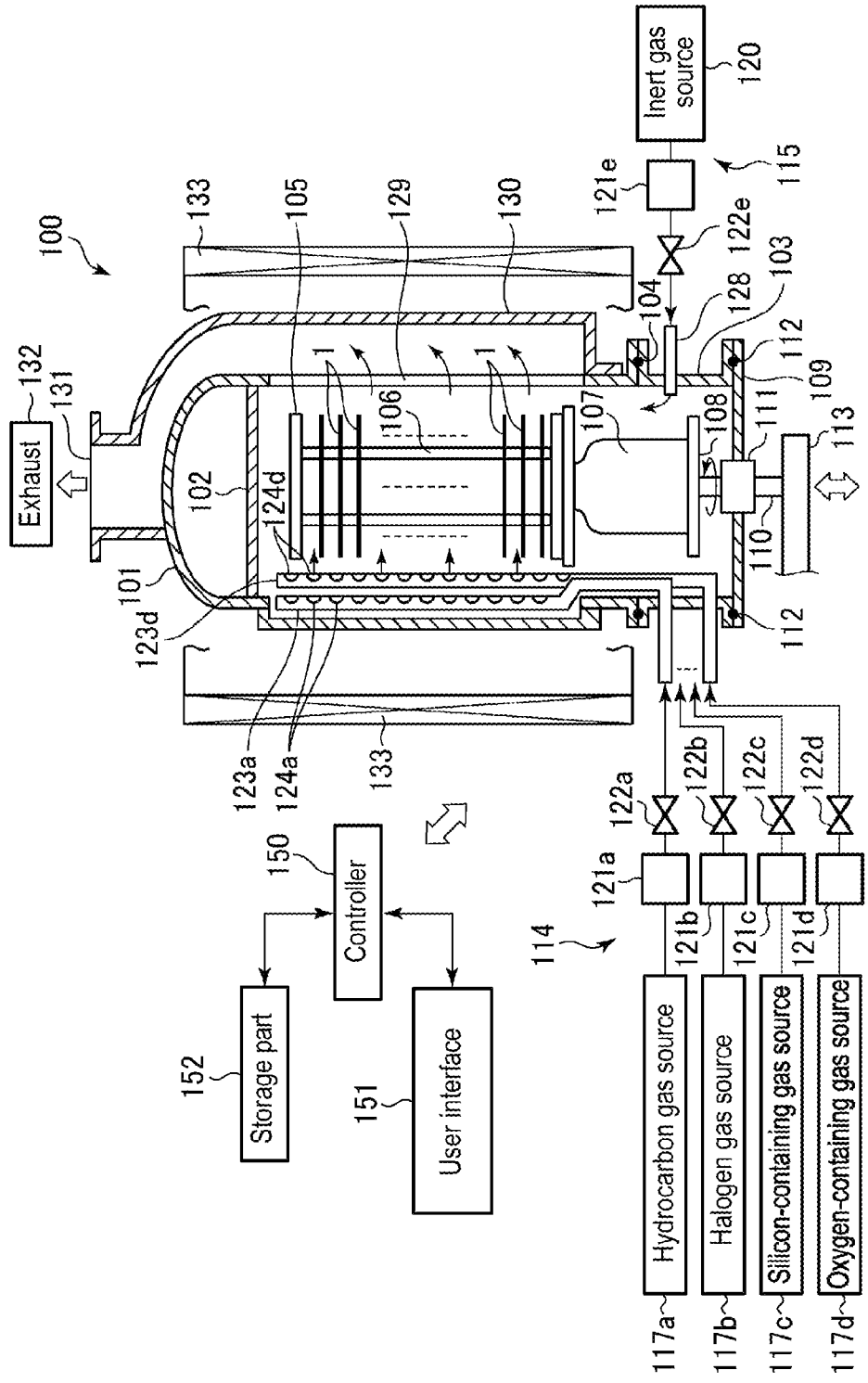

SELECTIVE GROWTH METHOD AND SUBSTRATE PROCESSING APPARATUS

CROSS-REFERENCE TO RELATED APPLICATION

This application claims the benefit of Japanese Patent Application No. 2014-220157, filed on Oct. 29, 2014, in the Japan Patent Office, the disclosure of which is incorporated herein in its entirety by reference.

TECHNICAL FIELD

The present disclosure relates to a selective growth method and a substrate processing apparatus.

BACKGROUND

As a selective growth method of selectively growing a thin film on an underlayer, there are known a single crystalline homo-epitaxial growth method and a single crystalline hetero-epitaxial growth method which use a plane orientation of a crystal surface of the underlayer. For example, there is a homo-epitaxial growth method which grows a silicon epitaxial layer on a single crystalline silicon film used as an underlayer.

In addition, for example, there is a hetero-epitaxial growth method which grows a silicon-germanium epitaxial layer on a single crystalline silicon film used as an underlayer.

However, the existing homo-epitaxial growth method or hetero-epitaxial growth method has limits as follows:

The underlayer has a limit to selectively grow a film thereon

There is a need to clean an interface

There is a need for a high temperature process

Thus, these methods fail to apply a finer semiconductor device structure which is currently required.

SUMMARY

Some embodiments of the present disclosure provide a selective growth method which is applicable to a finer semiconductor device structure, and a substrate processing apparatus which is capable of performing the selective growth method.

According to one embodiment of the present disclosure, there is provided a selective growth method of selectively growing a thin film on exposed surfaces of an underlying insulation film and an underlying metal film, which includes: selectively growing a film whose thickness is decreased by combustion on the underlying metal film using metal of the underlying metal film as a catalyst; and selectively growing a silicon oxide film on the underlying insulation film while combusting the film whose thickness is decreased by combustion.

According to another embodiment of the present disclosure, there is provided a substrate processing apparatus of selectively growing a thin film on exposed surfaces of an insulation film and a metal film of a target object, which includes: a processing chamber configured to accommodating the target object therein; a gas supply mechanism configured to at least supply a hydrocarbon gas, a halogen gas or a halogenated hydrocarbon gas, a silicon-containing gas, and an oxygen-containing gas, into the processing chamber; a heating device configured to heat the processing chamber; an exhaust mechanism configured to exhaust the processing chamber; and a controller configured to control the gas supply mechanism, the heating device, and the exhaust mechanism, wherein the controller controls the gas supply mechanism, the heating device and the exhaust mechanism such that the aforementioned selective growth method is performed on the target object inside the processing chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 5 is a flowchart showing an example of a selective growth method according to a second embodiment of the present disclosure.

FIG. 11 is a schematic longitudinal sectional view of an example of a substrate processing apparatus according to a fourth embodiment of the present disclosure.

DETAILED DESCRIPTION

Figure 1:
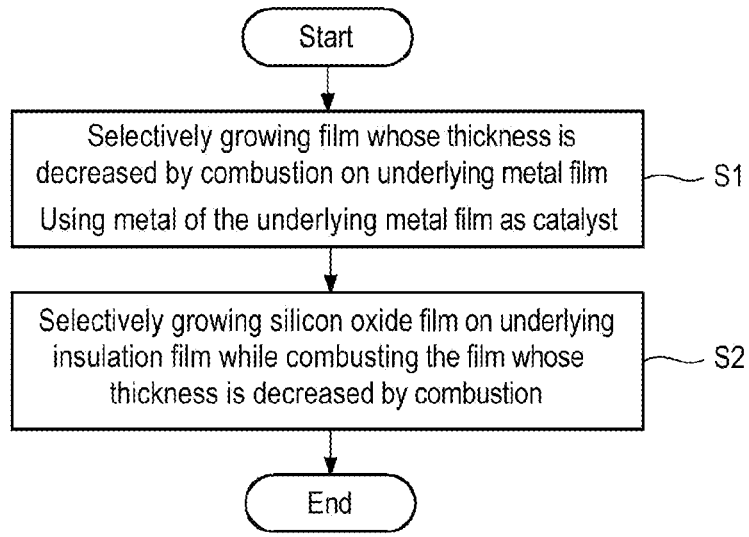
FIG. 1 is a flowchart showing an example of a selective growth method according to a first embodiment of the present disclosure.

Hereinafter, exemplary embodiments of the present disclosure will be described in detail with reference to the accompanying drawings. In the drawings, like reference numerals denote like elements. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Selective Growth Method

FIG. 1 is a flowchart showing an example of a selective growth method according to a first embodiment of the present disclosure. FIG. 2A to FIG. 2E are schematic cross-sectional views showing states of a target object during a sequence shown in FIG. 1.

Figure 2A:
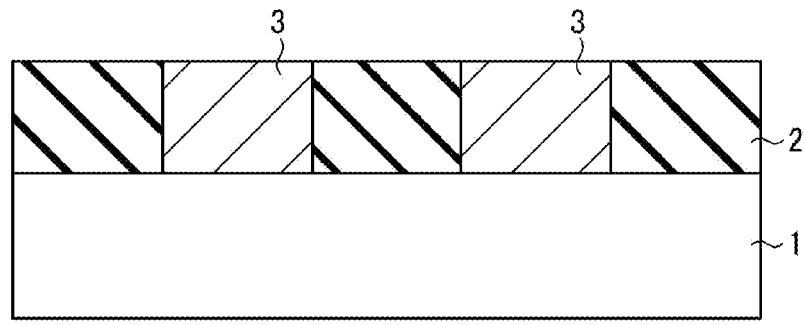
FIG. 2A to 2E are schematic cross-sectional views showing states of a target object during a sequence shown in FIG. 1.

First, as shown in FIG. 2A, for example, a silicon wafer 1 (hereinafter, referred to as "wafer") used as a target object is prepared. A structure in which an insulation film and a metal film is formed on a surface of the wafer 1, is formed. The structure shown in FIG. 2A corresponds to a structure formed when manufacturing a semiconductor integrated circuit device. For example, the insulation film is a silicon oxide film and the metal film is a tungsten film 3. An example of the silicon oxide film includes a $SiO_2$ film 2. In FIG. 2A, a pattern in which the $SiO_2$ film 2 and the tungsten film 3 are alternately arranged, is shown. Exposed surfaces of the $SiO_2$ film 2 and the tungsten film 3 correspond to a surface to be processed of the wafer 1. This surface to be processed is an underlying film on which a thin film is selectively grown.

Subsequently, as shown in step S1 of FIG. 1 and FIG. 2B, a film whose thickness is decreased by combustion is selectively grown on the metal film (in this embodiment, the tungsten film 3) used as the underlying film. For example, a carbon film 4 is used as the film whose thickness is decreased by combustion. The carbon film 4 is selectively grown on the tungsten film 3 using metal (in this embodiment, tungsten) of the underlying film as a catalyst.

Figure 3:
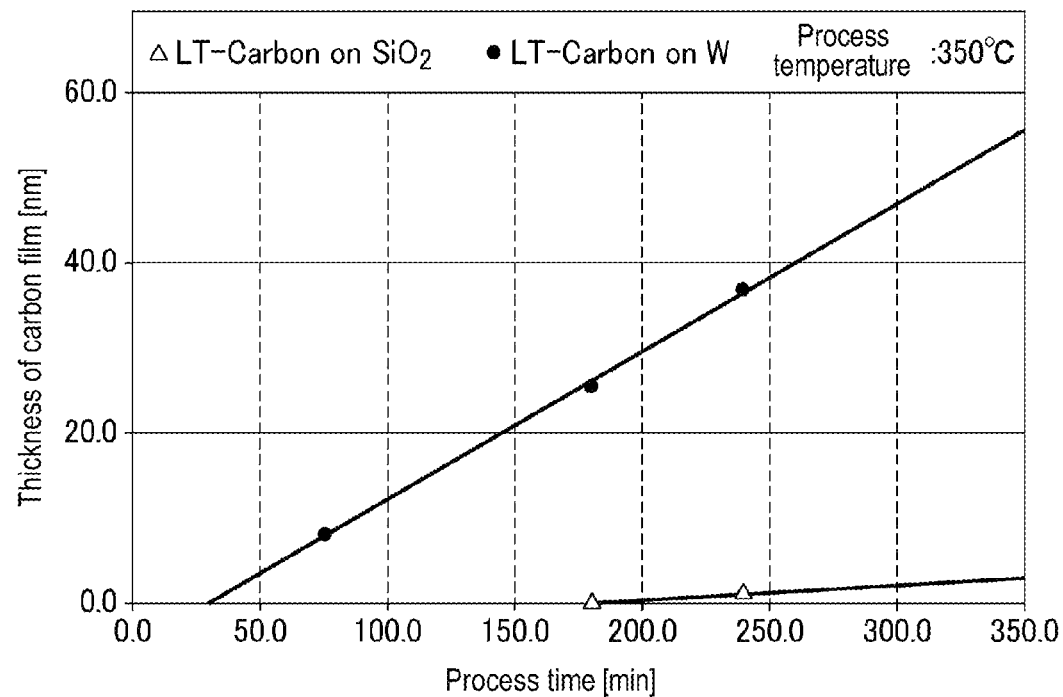
FIG. 3 is a view showing a relationship between a process time and a thickness of a carbon film.

FIG. 3 is a view showing a relationship between a process time and a thickness of the carbon film 4. In FIG. 3, there is shown a case in which the carbon film 4 was formed on the $SiO_2$ film 2 at low temperature (Δ: LT-Carbon on $SiO_2$) and a case in which the carbon film 4 was formed on the tungsten film 3 at low temperature (•: LT-Carbon on W). In addition, a hydrocarbon gas and a halogen gas were used as a source gas of the carbon film 4. In this embodiment, a butadiene ($C_4H_6$) gas and a chlorine ($Cl_2$) gas were used as the hydrocarbon gas and the halogen gas, respectively.

As shown in FIG. 3, when the carbon film 4 was formed on the $SiO_2$ film 2 at low temperature (e.g., a process temperature of 350 degrees C.) using the $C_4H_6$ gas and the $Cl_2$ gas as the source gas, the carbon film 4 began to be formed on the $SiO_2$ film 2 after a time lapse of about 170 to 180 min. On the other hand, when the carbon film 4 was formed on the tungsten film 3 at the process temperature of 350 degrees C., the carbon film 4 began to be formed on the tungsten film 3 after a time lapse of about 30 min. In other words, in a carbon film formation step as in this embodiment, it was found that a large difference (ranging from 140 to 150 min) between a time for which the carbon film 4 is incubated on the $SiO_2$ film 2 and a time for which the carbon film 4 is incubated on the tungsten film 3 is generated.

The reason for this may be that the tungsten film 3 has a catalytic action for adsorbing $C_4H_6$ in the $C_4H_6$ gas and decomposing $Cl_2$ molecules of the $Cl_2$ gas.

An amorphous carbon film is deposited on the tungsten film 3 by the following reactions:

$$C_4H_6 \rightarrow C_4H_5 + H \quad (1)$$

$$Cl_2 \rightarrow 2Cl \quad (2)$$

$$C_4H_5 + Cl \rightarrow C_4H_5Cl \quad (3)$$

$$C_4H_5Cl + C_4H_6 \rightarrow \text{Amorphous carbon} \quad (4)$$

On the other hand, the amorphous carbon film is deposited on the $SiO_2$ film 2 by the following reactions:

$$C_4H_6 + Cl_2 \rightarrow C_4H_5Cl + HCl \quad (5)$$

$$C_4H_5Cl + C_4H_6 \rightarrow \text{Amorphous carbon} \quad (6)$$

Among the above reactions, reactions (1)+(2)+(3) occurs very fast as compared with the reaction (5).

$$((1)+(2)+(3) \gg (5))$$

The reaction (4) occurs at the same speed as the reaction (6).

$$((4)=(6))$$

In other words, since the reactions (1)+(2)+(3) occur very fast as compared with the reaction (5), a difference between an incubation time for which the carbon film 4 lives on the $SiO_2$ film 2 and an incubation time for which the carbon film 4 lives on the tungsten film 3 is generated.

Figure 2B:
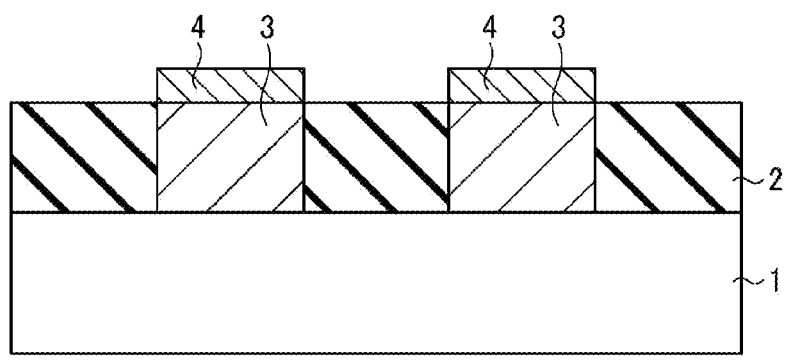

In this way, as shown in FIG. 2B, the film (e.g., the carbon film 4) whose thickness is decreased by combustion can be selectively grown on the tungsten film 3.

An example of process conditions in step S1 of selectively growing the carbon film 4 on the tungsten film 3 is as follows:
Flow rate of the $C_4H_6$ gas: 200 sccm
Flow rate of the $Cl_2$ gas: 50 sccm
Process time: 30 to 180 min
Process temperature: 350 degrees C.
Process pressure: 800 Pa (about 6 Torr)

Further, in some embodiments, it is practical that the flow rate of the $C_4H_6$ gas falls within a range from 100 to 400 sccm, the flow rate of the $Cl_2$ gas falls within a range from 1 to 100 sccm, and the process pressure falls within a range from 1 to 20 Torr (133.3 to 2,666 Pa).

Further, in some embodiments, the process time in step S1 may be set in a range from the incubation time of the carbon film 4 on the tungsten film 3 to the incubation time of the carbon film 4 on the $SiO_2$ film 2.

Subsequently, as shown in step S2 of FIG. 1 and FIGS. 2C and 2D, a silicon oxide film (e.g., an $SiO_2$ film 5) is selectively grown (or deposited) on the underlying insulation film (in this embodiment, the $SiO_2$ film 2) while combusting the film whose thickness is decreased by combustion (in this embodiment, the carbon film 4). An example of a source gas of the $SiO_2$ film 5 is an aminosilane-based gas, e.g., a bis(dimethylamino)silane (2DMAS) gas, and an example of an oxidant gas is an ozone ($O_3$) gas.

An example of process conditions in step S2 is as follows:
Flow rate of the 2DMAS gas: 200 sccm
Flow rate of the $O_3$ gas: 1,000 sccm
Process time: 30 to 180 min
Process temperature: 350 degrees C.
Process pressure: 133.3 Pa (1 Torr)

Figure 2C:
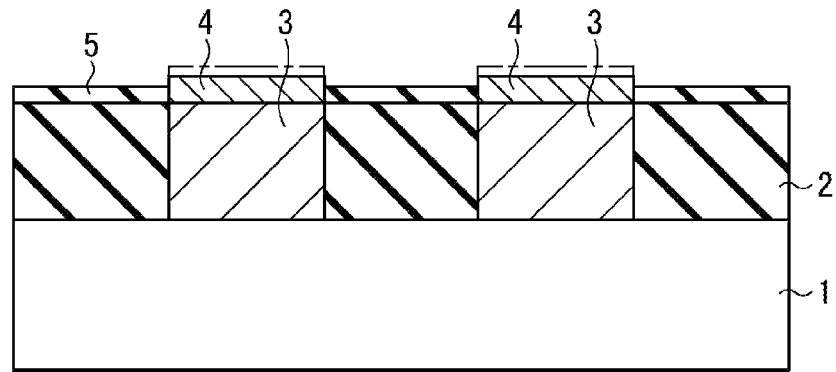
Figure 2D:
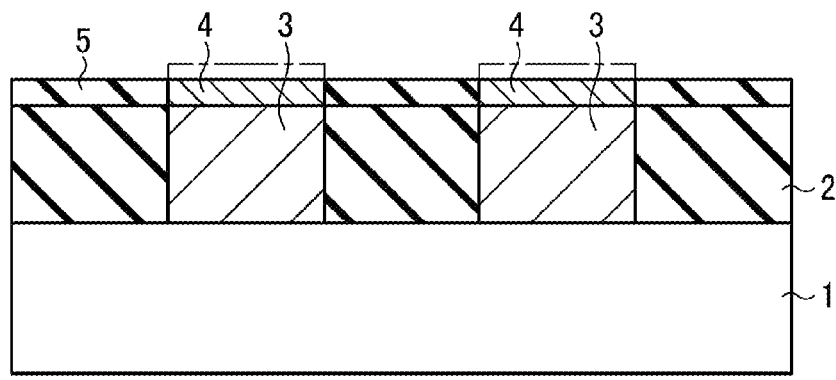

In step S2, the carbon film 4 is gradually decreased in thickness by combustion, whereas the $SiO_2$ film 5 is gradually increased in thickness with the deposition (see FIGS. 2C and 2D).

Further, in some embodiments, the process time in step S2 may be set to a time at which the carbon film 4 whose thickness is gradually decreased is nearly balanced with respect to the $SiO_2$ film 5 whose thickness is gradually increased.

Figure 2E:
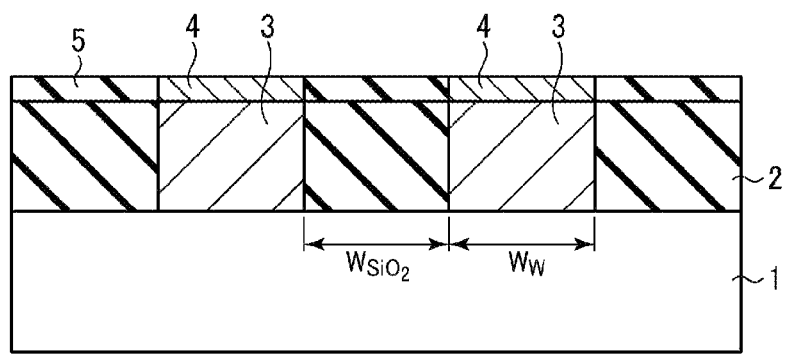

According to the first embodiment including steps S1 and S2 as described above, it is possible to selectively grow the carbon film 4 and the $SiO_2$ film 5. Thus, as shown in FIG. 2E, it is possible to obtain the carbon film 4 which is self-aligned with a pattern of the underlying tungsten film 3 and the $SiO_2$ film 5 which is self-aligned with a pattern of the underlying $SiO_2$ film 2.

In addition, according to the first embodiment, the selective growth of the carbon film 4 and the $SiO_2$ film 5 eliminates a need for a lithography process. Thus, even if both a width ($W_w$) of the tungsten film 3 and a width ($W_{SiO2}$) of the $SiO_2$ film 2 are reduced beyond a resolution limit of lithography, the carbon film 4 and the $SiO_2$ film 5 can be formed on the tungsten film 3 and the $SiO_2$ film 2, respectively.

The process temperature at which the carbon film 4 and the $SiO_2$ film 5 are selectively grown may be a low temperature, e.g., 350 degrees C.

Figure 4:
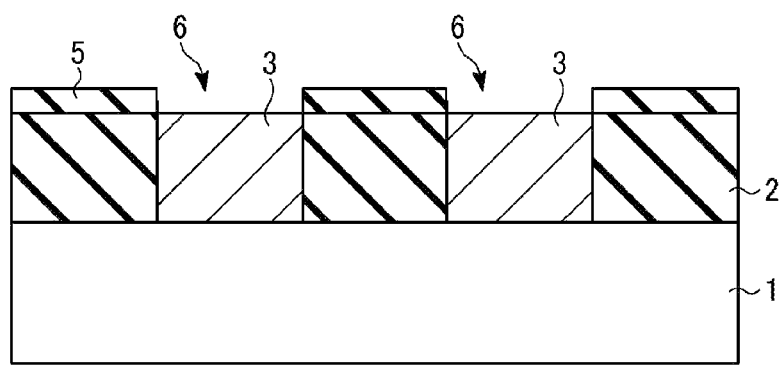
FIG. 4 is a cross-sectional view showing a state where a carbon film is removed.

Further, as shown in FIG. 4, the carbon film 4 may be removed. For example, the oxidant gas used for the selective growth of the $SiO_2$ film 5 may be used in removing the carbon film 4. The removal of the carbon film 4 generates holes 6 which are self-aligned with the pattern of the tungsten film 3 on the underlying tungsten film 3.

An example of a material which can be selectively grown on the metal film such as the tungsten film 3 and is decreased in thickness by combustion, may include ruthenium. As such, the carbon film 4 may be replaced by a ruthenium film.

In addition to the chlorine ($Cl_2$) gas, an iodine ($I_2$) gas may be effectively used as the halogen gas used for the selective growth of the carbon film 4. Alternatively, a halogenated hydrocarbon gas which is not the halogen alone, may be used as the halogen gas.

As described above, according to the first embodiment, it is possible to provide a selective growth method which can be applied to a finer semiconductor device structure.

Second Embodiment

Other Selective Growth Method

While in the first embodiment, the selective growth of the carbon film 4 and the $SiO_2$ film 5 has been described to be performed once, the present disclosure is not limited thereto. In some embodiments, the selective growth of the carbon film 4 and the $SiO_2$ film 5 may be performed twice or more such that each of the carbon film 4 and the $SiO_2$ film 5 is deposited to have a designed thickness. A second embodiment corresponds to such a case.

FIG. 5 is a flowchart showing an example of a selective growth method according to a second embodiment of the present disclosure. FIGS. 6A to 6H are schematic cross-sectional views showing states of a target object during a sequence shown in FIG. 5.

Figure 6A:
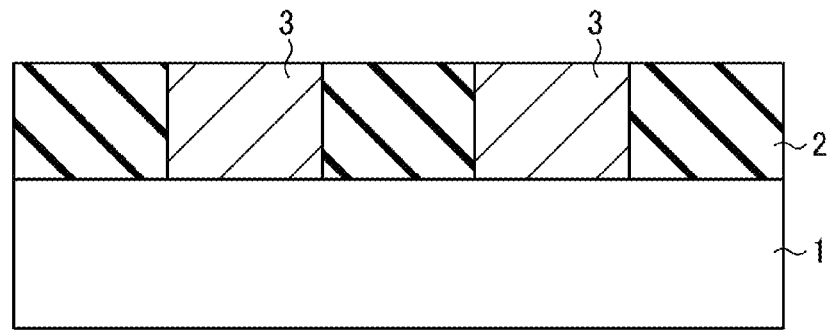
FIG. 6A to 6H are schematic cross-sectional views showing states of a target object during a sequence shown in FIG. 5.
Figure 6B:
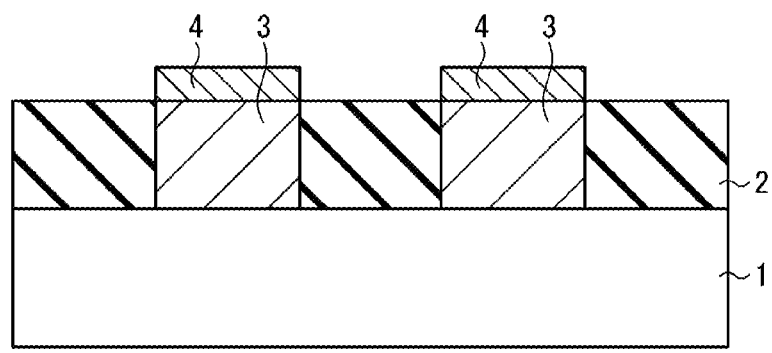
Figure 6C:
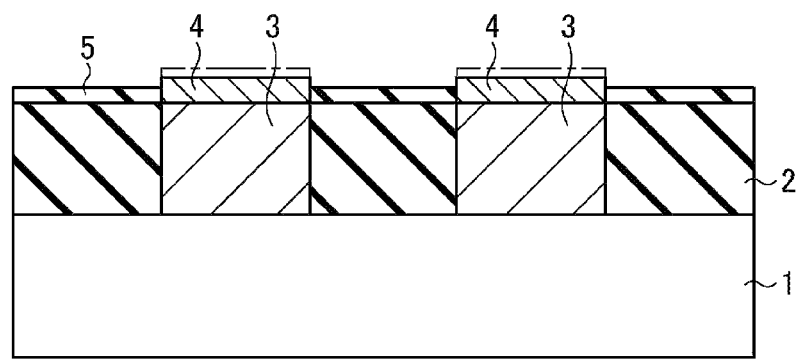
Figure 6D:
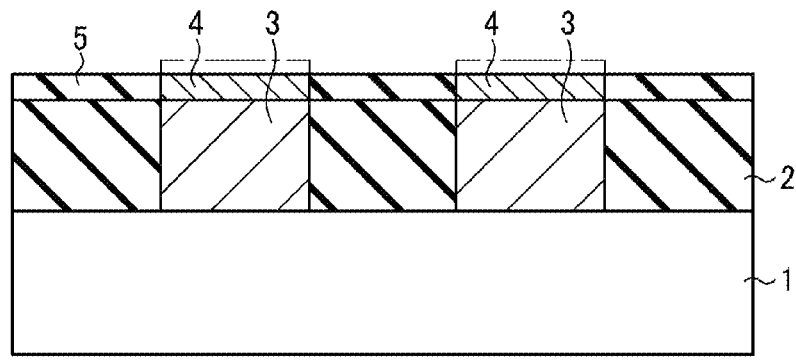

First, as shown in steps S1 and S2 of FIG. 5 and FIGS. 6A to 6D, a structure as shown in FIG. 6D is obtained by performing the sequence according to the first embodiment.

Figure 6E:
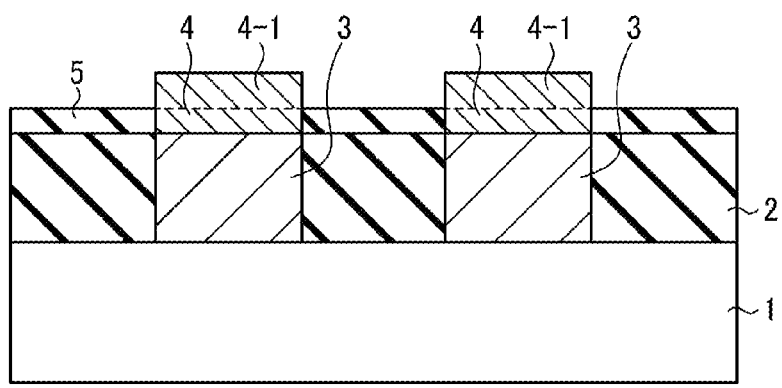

Subsequently, as shown in step S3 of FIG. 5 and FIG. 6E, an additional film (in this embodiment, a carbon film 4-1) whose thickness is decreased by combustion is selectively grown on the remaining film (in this embodiment, the carbon film 4) whose thickness is decreased by combustion.

An example of process conditions in step S3 is as follows:
Flow rate of the $C_4H_6$ gas: 200 sccm
Flow rate of the $Cl_2$ gas: 50 sccm
Process time: 180 min
Process temperature: 350 degrees C.
Process pressure: 800 Pa (about 6 Torr)

The process conditions in step S3 may be the same as those in step S1. However, since the underlying film has been changed from the underlying tungsten film 3 to the carbon film 4, the process conditions may be properly changed to meet the changed underlying carbon film 4.

Figure 6F:
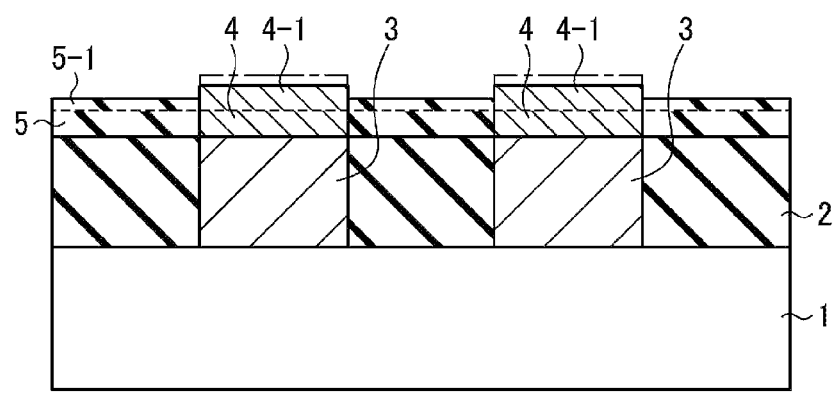
Figure 6G:
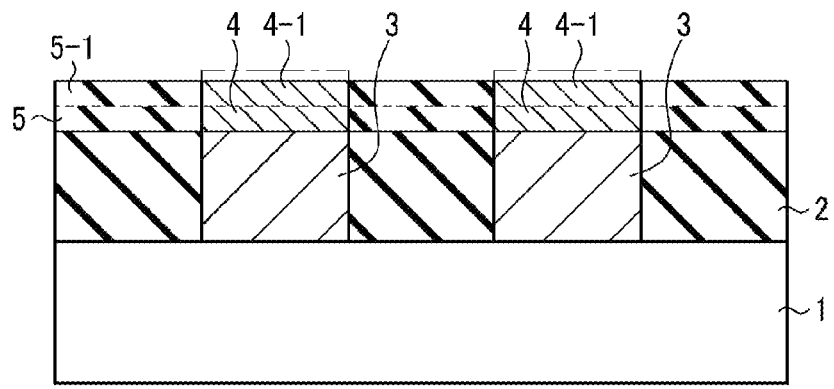

Subsequently, as shown in step S4 of FIG. 5, and FIGS. 6F and 6G, an additional silicon oxide film (in this embodiment, a $SiO_2$ film 5-1) is selectively grown on the underlying $SiO_2$ film 5 while combusting the additional film (in this embodiment, the carbon film 4-1).

An example of process conditions in step S4 is as follows:
Flow rate of the 2DMAS gas: 200 sccm
Flow rate of the $O_3$ gas: 1,000 sccm
Process time: 30 min
Process temperature: 350 degrees C.
Process pressure: 133.3 Pa (1 Torr)

The process conditions in step S4 may be the same as those in step S2.

Subsequently, as shown in step S5 of FIG. 5, it is determined whether a sequence of steps S3 and S4 is repeatedly performed a predetermined number of times. If it is determined that the sequence of steps S3 and S4 is repeatedly performed the predetermined number of times ("Yes"), the process is ended. On the other hand, if it is determined that the sequence of steps S3 and S4 is not performed the predetermined number of times ("No"), the process returns to step S3 and the sequence of steps S3 and S4 is repeated.

Figure 6H:
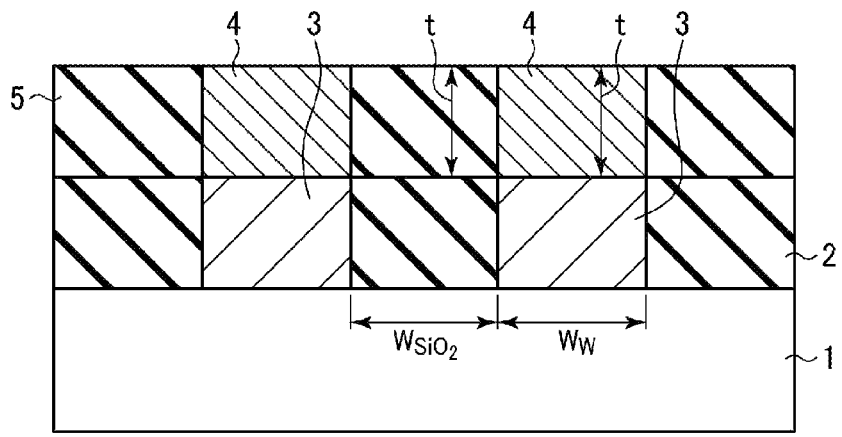

By performing the sequence of steps S3 and S4 once or more, it is possible to obtain a final structure composed of the carbon film 4 and the $SiO_2$ film 5 each having a designed thickness (t) required for the semiconductor integrated circuit device, as shown in FIG. 6H.

Figure 7:
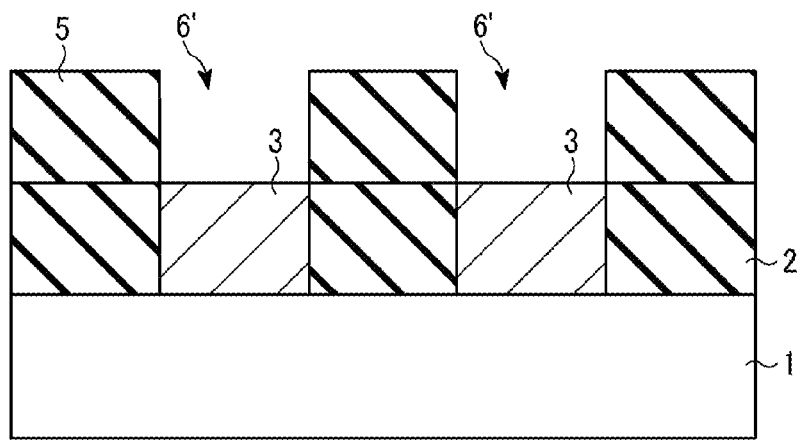
FIG. 7 is a cross-sectional view showing a state where a carbon film is removed.

Further, even in the second embodiment, as shown in FIG. 7, the carbon film 4 may be removed. The removal of the carbon film 4 generates holes 6' which are self-aligned with the pattern of the underlying tungsten film 3 on the underlying tungsten film 3. The hole 6' has a depth thicker than that of the hole 6 in the first embodiment.

Third Embodiment

Other Selective Growth Method

In the first and second embodiments, tungsten has been described to be used as a material of the underlayer of the carbon film 4. Examples of a metal having the same catalytic action as that of the tungsten film 3 may include Ti, V, Cr, Mn, Fe, Co, Ni, Cu, Zn, Ga, Ge, Si, Zr, Nb, Mo, Tc, Ru, Rh, Pd, In, Sn, Hf, Ta, Re, Os, Ir, Pt, Au, or the like.

However, some of the above metals have difficulty in, at low temperature, adsorbing hydrocarbon contained in a hydrocarbon gas, or decomposing molecules of the halogen gas or the halogenated hydrocarbon gas.

In some embodiments, an additional metal film may be formed on an exposed surface of the underlying metal film so as to facilitate the adsorption of hydrocarbon contained in the hydrocarbon gas and the decomposition of molecules of the halogen gas or the halogenated hydrocarbon gas, at a temperature lower than that of metal existing in the underlying metal film. A third embodiment corresponds to such a case.

Figure 8:
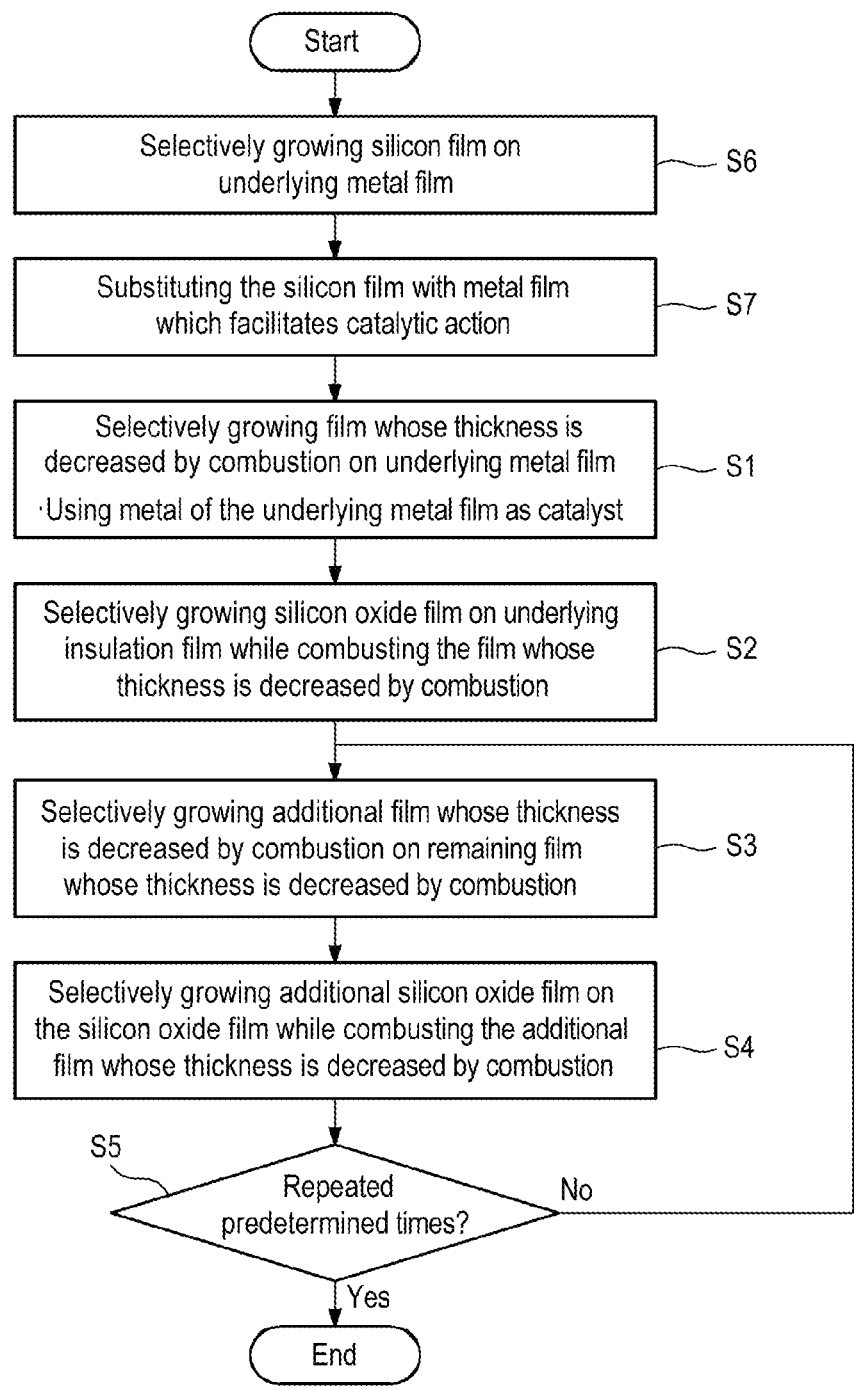
FIG. 8 is a flowchart showing an example of a selective growth method according to a third embodiment of the present disclosure.

FIG. 8 is a flowchart showing an example of a selective growth method according to a third embodiment of the present disclosure. FIGS. 9A to 9J are schematic cross-sectional views showing states of a target object during a sequence shown in FIG. 8.

Figure 9A:
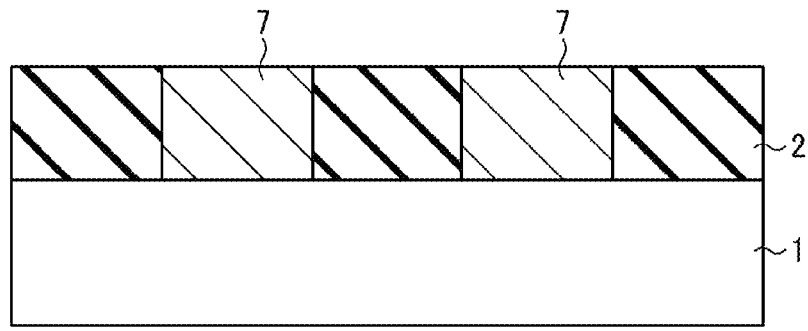
FIG. 9A to 9J are schematic cross-sectional views showing states of a target object during a sequence shown in FIG. 8.
Figure 9B:
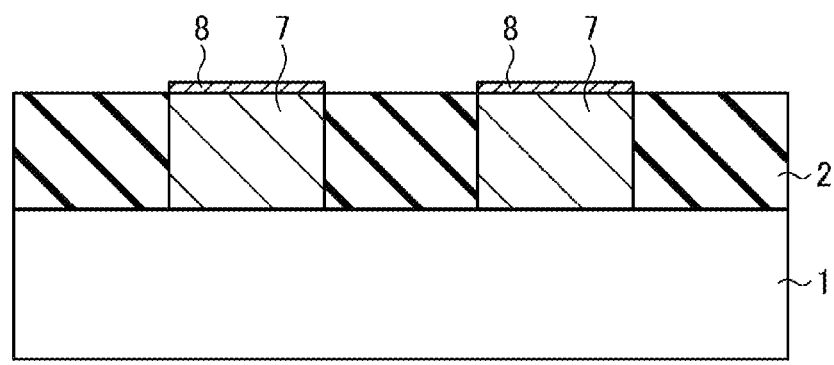

First, as shown in step S6 of FIG. 8 and FIGS. 9A and 9B, a silicon film 8 is selectively grown on an underlying metal film (in this embodiment, a cobalt film 7).

An example of process conditions in step S6 is as follows:
Flow rate of $SiH_4$ gas: 200 sccm
Process time: 60 min
Process temperature: 350 degrees C.
Process pressure: 133.3 Pa (1 Torr)

Figure 9C:
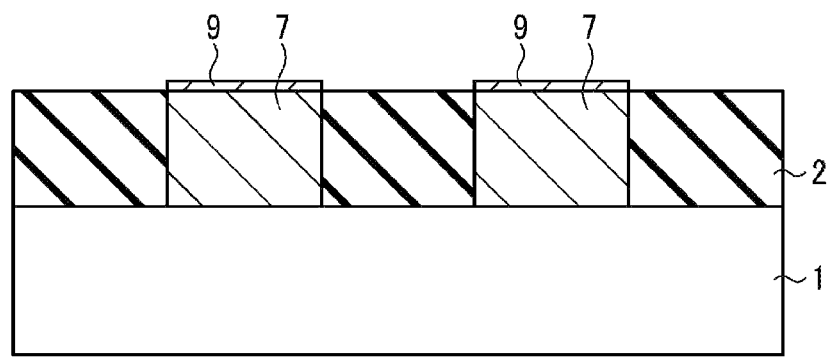
Figure 9D:
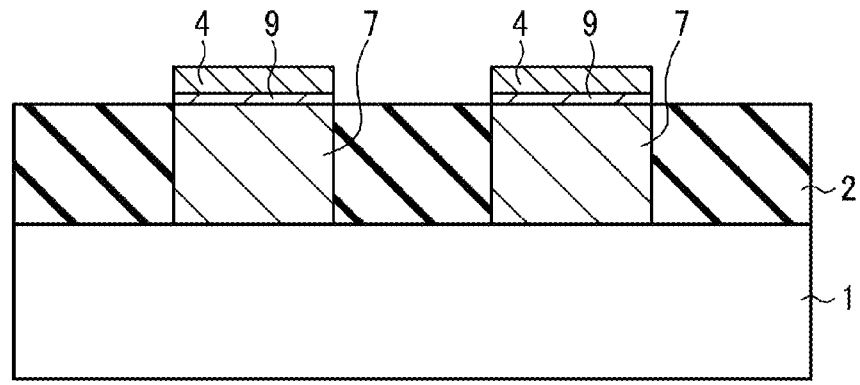
Figure 9E:
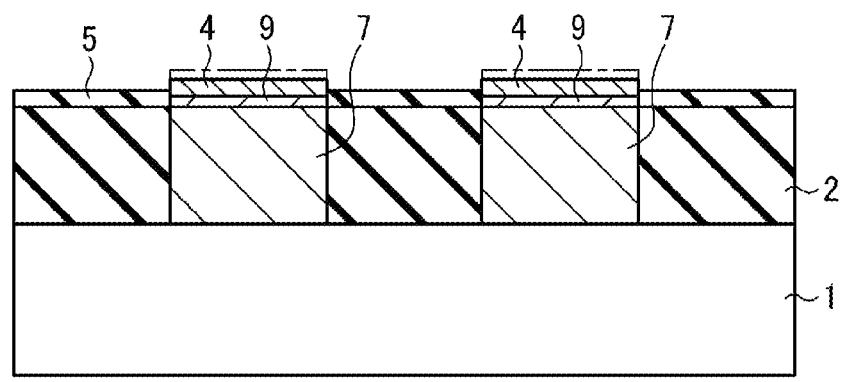
Figure 9F:
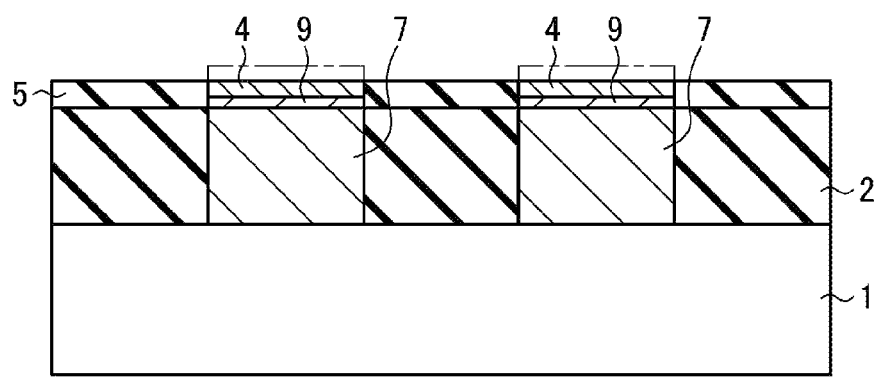
Figure 9G:
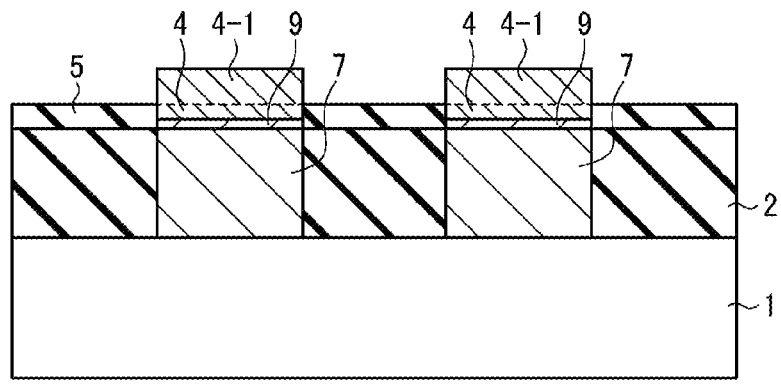
Figure 9H:
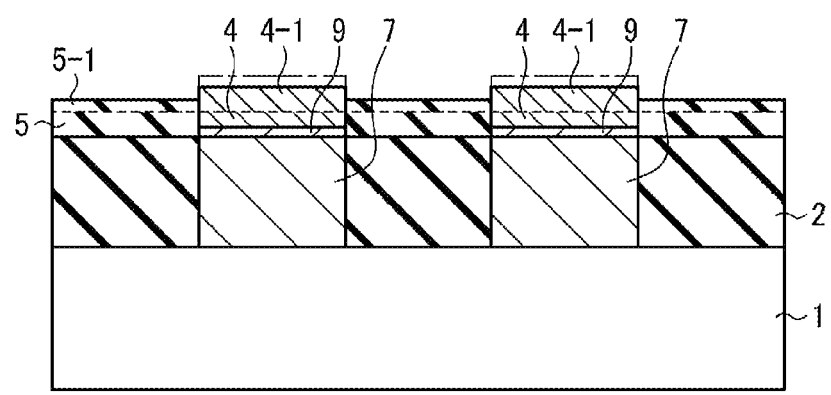
Figure 9I:
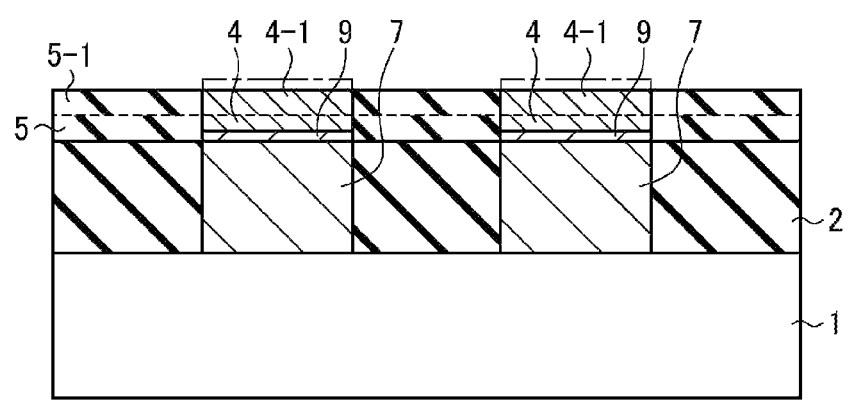

Subsequently, as shown in step S7 of FIG. 8 and FIG. 9C, the silicon film 8 is substituted with the additional metal film which facilitates a catalytic action. In this embodiment, the silicon film 8 was substituted with a tungsten film 9 as the additional metal film.

An example of process conditions in step S7 is as follows:
Flow rate of $WF_6$ gas: 200 sccm
Process time: 30 min
Process temperature: 350 degrees C.
Process pressure: 133.3 Pa (1 Torr)

Subsequently, a sequence of steps S1 to S5 of FIG. 8 as shown in FIGS. 9D to 9I is performed as in the second embodiment, for example.

As described above, when metal of the underlying metal film has a poor catalytic action at a low temperature, the additional metal film made of metal having normal catalytic action even at a lower temperature, may be formed on the exposed surface of the underlying metal film.

Figure 9J:
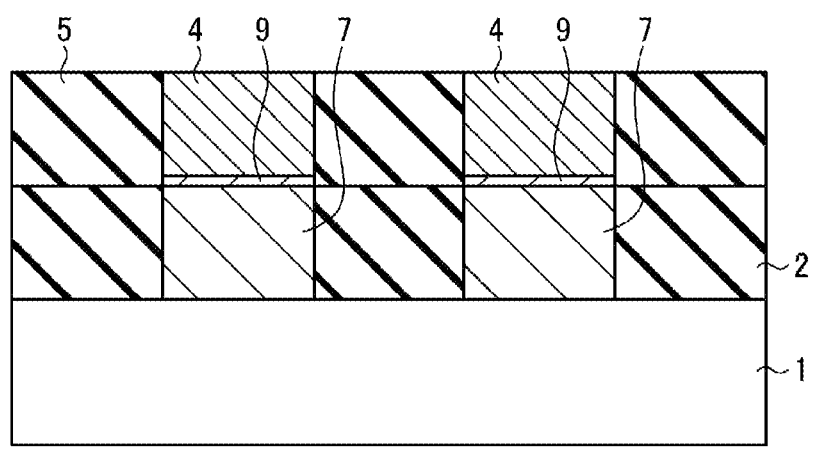

Assuming that the additional metal film (in this embodiment, the tungsten film 9) made of the metal having the normal catalytic action even at the lower temperature, is formed on the exposed surface of the underlying metal film (in this embodiment, the cobalt film 7), a final structure in which the tungsten film 9 is interposed between the cobalt film 7 and the carbon film 4 is obtained, as shown in FIG. 9J.

Figure 10:
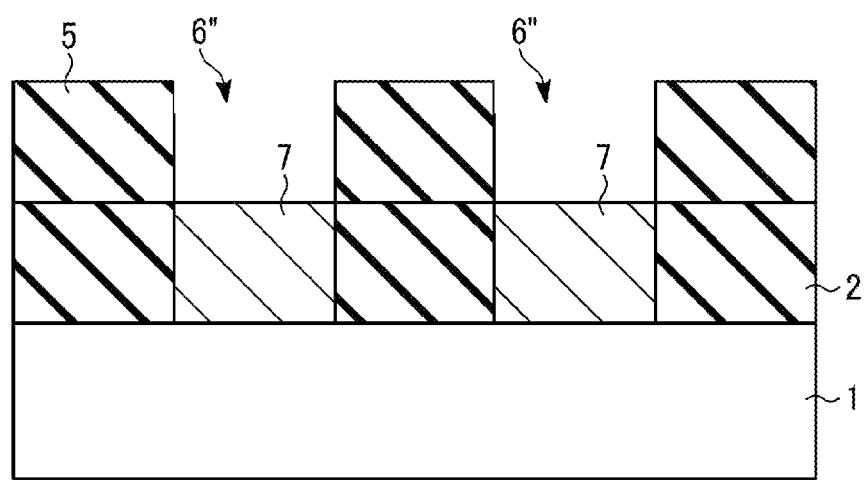
FIG. 10 is a cross-sectional view showing a state where a carbon film is removed.

Further, even in the third embodiment, the carbon film 4 and the tungsten film 9 may be removed, as shown in FIG. 10. The removal of the carbon film 4 and the tungsten film 9 generates holes 6" which are self-aligned with a pattern of the cobalt film 7 and have a depth deeper than that in the first embodiment, on the underlying cobalt film 7, as described in the second embodiment.

Fourth Embodiment

A fourth embodiment relates to an example of a substrate processing apparatus which is capable of performing the selective growth methods according to the first to third embodiments.

FIG. 11 is a schematic longitudinal sectional view showing an example of a substrate processing apparatus according to a fourth embodiment of the present disclosure.

As shown in FIG. 11, a substrate processing apparatus 100 includes a cylindrical processing chamber 101 having a ceiling with a bottom end opened. The entirety of the processing chamber 101 is formed of, e.g., quartz. A quartz ceiling plate 102 is located at the ceiling inside the processing chamber 101. Also, for example, a manifold 103, which is formed of a stainless steel to have a cylindrical shape, is connected to a lower end opening portion of the processing chamber 101 through a sealing member 104 such as an O-ring.

The manifold 103 supports a lower end portion of the processing chamber 101. A wafer boat 105 of quartz, into which a plurality of (e.g., 50 to 120) semiconductor wafers W (in this embodiment, silicon wafers 1) is loaded as target objects in multiple stages, is insertable into the processing chamber 101 through a lower portion of the manifold 103.

The wafer boat 105 includes a plurality of supporting pillars 106, and the plurality of wafers 1 are supported by grooves (not shown) which are formed in each of the supporting pillars 106.

The wafer boat 105 is mounted on a table 108 with a quartz heat insulating tube 107 interposed between the wafer boat 105 and the table 108. The table 108 is supported on a rotation shaft 110 that passes through a cover part 109. The cover part 109 is made of, e.g., a stainless steel, and opens or closes a lower end opening portion of the manifold 103. A magnetic fluid seal 111 is disposed at a through portion of the rotation shaft 110. The magnetic fluid seal 111 closely seals and rotatably supports the rotation shaft 110. Also, for example, a seal member 112 such as an O-ring is disposed between a periphery of the cover part 109 and a lower end portion of the manifold 103, thus maintaining sealability in the processing chamber 101. The rotation shaft 110, for example, is disposed at a front end of an arm 113 that is supported by an ascending/descending instrument (not shown) such as a boat elevator. With this configuration, the wafer boat 105 and the cover part 109 are elevated in an integrated manner to be inserted into/separated from the processing chamber 101.

The substrate processing apparatus 100 includes a process gas supply mechanism 114 configured to supply a process gas into the processing chamber 101 and an inert gas supply mechanism 115 configured to supply an inert gas into the processing chamber 101.

The process gas supply mechanism 114 includes a hydrocarbon gas supply source 117a, a halogen gas supply source 117b, a silicon-containing gas supply source 117c, and an oxygen-containing gas supply source 117d.

In this embodiment, the hydrocarbon gas supply source 117a supplies a $C_4H_6$ gas as the hydrocarbon gas into the processing chamber 101. The halogen gas supply source 117b supplies a $Cl_2$ gas as the halogen gas into the processing chamber 101. The silicon-containing gas supply source 117c supplies a 2DMAS gas as the silicon-containing gas into the processing chamber 101. The oxygen-containing gas supply source 117d supplies an $O_3$ gas as the oxygen-containing gas into the processing chamber 101.

The inert gas supply mechanism 115 includes an inert gas supply source 120. The inert gas supply source 120 supplies an $N_2$ gas as the inert gas into the processing chamber 101.

In some embodiments, the halogen gas supply source 117b may supply a halogenated hydrocarbon gas, instead of the halogen gas, into the processing chamber 101.

The hydrocarbon gas supply source 117a is coupled to a dispersion nozzle 123a via a flow rate controller 121a and an on-off valve 122a. Similarly, the halogen gas supply source 117b is coupled to a dispersion nozzle 123b (not shown) via a flow rate controller 121b and an on-off valve 122b. The silicon-containing gas supply source 117c is coupled to a dispersion nozzle 123c (not shown) via a flow rate controller 121c and an on-off valve 122c. The oxygen-containing gas supply source 117d is coupled to a dispersion nozzle 123d via a flow rate controller 121d and an on-off valve 122d.

Each of the dispersion nozzles 123a to 123d, which includes a quartz tube, penetrates a sidewall of the manifold 103 inward, bends upward, and extends vertically. At a vertical portion of each of the dispersion nozzles 123a to 123d, a plurality of gas discharge holes 124a to 124d is formed spaced apart from each other by a predetermined distance. The hydrocarbon gas, the halogen gas, the silicon-containing gas, and the oxygen-containing gas are substantially uniformly discharged from the respective gas discharge holes 124a to 124d into the processing chamber 101 in a horizontal direction.

The inert gas supply source 120 is coupled to a nozzle 128 via a flow rate controller 121e and an on-off valve 122e. The nozzle 128 penetrates through the sidewall of the manifold 103 and horizontally discharges the inert gas into the processing chamber 101 through a front end thereof.

An exhaust vent 129 through which gas inside the processing chamber 101 is exhausted, is formed in a portion opposite to the dispersion nozzles 123a to 123d in the processing chamber 101. The exhaust vent 129 has an elongated shape formed by chipping the sidewall of the processing chamber 101 in the vertical direction. At a portion corresponding to the exhaust vent 129 of the processing chamber 101, an exhaust vent cover member 130 with a C-shaped section is installed by welding to cover the exhaust vent 129. The exhaust vent cover member 130 extends upward along the sidewall of the processing chamber 101, and defines a gas outlet 131 at the top of the processing chamber 101. The gas outlet 131 is connected to an exhaust mechanism 132 including a vacuum pump. The exhaust mechanism 132 exhausts the processing chamber 101 so as to discharge the process gas used for the process and to change an internal pressure of the processing chamber 101 into a predetermined process pressure.

A cylindrical heating device 133 is disposed around the processing chamber 101. The heating device 133 activates the process gas supplied into the processing chamber 101 and heats the target object (in this embodiment, the wafer 1) loaded into the processing chamber 101.

Respective components of the substrate processing apparatus 100 are controlled by a controller 150 including, e.g., a microprocessor (computer). The controller 150 is connected to a user interface 151. The user interface 151 is provided with an input part including a touch panel display or a keyboard for inputting, by an operator, a command to control the substrate processing apparatus 100, and a display part including a display for visually displaying an operation state of the substrate processing apparatus 100.

The controller 150 is connected to a storage part 152. The storage part 152 stores, under the control of the controller 150, control programs for implementing various processes performed by the substrate processing apparatus 100 or programs for executing processes on the respective components of the substrate processing apparatus 100 according to a processing condition, namely, recipes. The recipes are stored in a storage medium of the storage part 152. The storage medium may be a hard disc or a semiconductor device memory, or a portable medium such as a CDROM, a DVD, or a flash memory. In some embodiments, the recipes may be appropriately transferred from another device through a dedicated line. If necessary, the recipe is read from the storage part 152 in response to a command received from the user interface 151, and the controller 150 executes a process according to the read recipe. In this way, the substrate processing apparatus 100 performs a desired process under the control of the controller 150.

In this embodiment, the selective growth methods according to the first to third embodiments are performed under the control of the controller 150. The selective growth methods according to the first to third embodiments may be performed by the substrate processing apparatus 100 as shown in FIG. 11.

Although the present disclosure has been described according to the first to fourth embodiments, the present disclosure is not limited thereto. A variety of modifications may be made without departing from the spirit of the disclosures.

In the above embodiments, the specific processing conditions have been described, but are not limited thereto. As an example, the processing conditions may be varied depending on a volume of the processing chamber 101 with the target object loaded into, a change in process pressure of the processing chamber 101, or the like.

According to the present disclosure in some embodiments, it is possible to provide a selective growth method which can be applied to a finer semiconductor device structure, and a substrate processing apparatus which can perform the selective growth method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A selective growth method of selectively growing a thin film on exposed surfaces of an underlying insulation film and an underlying metal film, comprising:
   selectively growing a film whose thickness is decreased by combustion on the underlying metal film using metal of the underlying metal film as a catalyst; and
   selectively growing a silicon oxide film on the underlying insulation film while combusting the film whose thickness is decreased by combustion.

2. The method of claim 1, further comprising: after selectively growing the silicon oxide film, selectively growing an additional film whose thickness is decreased by combustion on the remaining film whose thickness is decreased by combustion; and selectively growing an additional silicon oxide film on the silicon oxide film while combusting the additional film whose thickness is decreased by combustion, wherein selectively growing the additional film and selectively growing the additional silicon oxide film are performed once or repeated a predetermined number of times.

3. The method of claim 1, further comprising: after selectively growing the silicon oxide film, removing the film whose thickness is decreased by combustion using the silicon oxide film as a mask.

4. The method of claim 2, further comprising: after selectively growing the additional silicon oxide film, removing the additional film whose thickness is decreased by combustion and the film whose thickness is decreased by combustion using the additional silicon oxide film as a mask.

5. The method of claim 1, wherein the film whose thickness is decreased by combustion is a carbon film or a ruthenium film.

6. The method of claim 5, wherein, when the film whose thickness is decreased by combustion is the carbon film, a source gas of the carbon film includes a hydrocarbon gas, and a halogen gas or a halogenated hydrocarbon gas, and the metal adsorbs hydrocarbon in the hydrocarbon gas and decomposes molecules of the halogen gas or the halogenated hydrocarbon gas.

7. The method of claim 6, wherein the halogen is any one of chlorine (Cl) and iodine (I).

8. The method of claim 1, wherein a source gas of the silicon oxide film includes a silicon-containing gas and an oxygen-containing gas.

9. The method of claim 6, wherein another metal film is formed on the exposed surface of the underlying metal film, the another metal film being formed of another metal which facilitates adsorbing hydrocarbon in the hydrocarbon gas and decomposing molecules of the halogen gas or the halogenated hydrocarbon gas at a temperature lower than that of the metal of the underlying metal film.

10. The method of claim 1, wherein the metal includes any one of Ti, V, Cr, Mn, Fe, Co, Ni, Cu, Zn, Ga, Ge, Si, Zr, Nb, Mo, Tc, Ru, Rh, Pd, In, Sn, Hf, Ta, W, Re, Os, Ir, Pt, and Au.

* * * * *